(12) United States Patent
Bothra et al.

(10) Patent No.: US 6,492,716 B1
(45) Date of Patent: Dec. 10, 2002

(54) SEAL RING STRUCTURE FOR IC CONTAINING INTEGRATED DIGITAL/RF/ANALOG CIRCUITS AND FUNCTIONS

(75) Inventors: Subhas Bothra, Fremont, CA (US); Thomas G. McKay, Felton, CA (US); Ravi Jhota, Sunnyvale, CA (US)

(73) Assignee: ZeeVo, Inc., Santa Clara, CA (US)

( * ) Notice: Subject to any disclaimer, the term of this patent is extended or adjusted under 35 U.S.C. 154(b) by 0 days.

(21) Appl. No.: 09/846,335

(22) Filed: Apr. 30, 2001

(51) Int. Cl.$^7$ ................................................ H01L 23/02
(52) U.S. Cl. ........................................ 257/678; 257/688
(58) Field of Search ................................. 257/678, 688, 257/620, 629; 438/106, 460, 113, 462

(56) References Cited

U.S. PATENT DOCUMENTS

| | | | | | |
|---|---|---|---|---|---|
| 5,831,330 | A | * | 11/1998 | Chang | 257/619 |
| 5,891,808 | A | * | 4/1999 | Chang et al. | 216/2 |
| 6,300,223 | B1 | * | 10/2001 | Chang et al. | 438/113 |
| 6,376,899 | B1 | * | 4/2002 | Seshan et al. | 257/620 |
| 6,412,786 | B1 | * | 7/2002 | Pan | 277/630 |

* cited by examiner

*Primary Examiner*—Tuan H. Nguyen
(74) *Attorney, Agent, or Firm*—Townsend and Townsend and Crew LLP

(57) ABSTRACT

Embodiments of the present invention provide a seal ring which includes a plurality of cuts separating the seal ring into seal ring portions which are disposed adjacent to different circuits in the integrated circuit die. The cuts reduce the noise coupling among the different circuits through the seal ring. To further isolate the sensitive RF/analog circuits from the noise generated by the digital circuit, the seal ring may be electrically (for dc noise) isolated from the substrate. This is accomplished, for instance, by inserting a polysilicon layer and gate oxide between the seal ring and the substrate. In addition, an n-well/p-well capacitor may be formed in series with the gate oxide, for instance, by implanting an n-well below the polysilicon layer in a p-type substrate. In this way, the seal ring provides substantially reduced noise coupling among the circuits but still maintains an effective wall around the periphery of the die to protect the circuits against moisture and ionic contamination penetration.

18 Claims, 3 Drawing Sheets

SEAL RING STRUCTURE FOR IC CONTAINING INTEGRATED DIGITAL/RF/ANALOG CIRCUITS AND FUNCTIONS

CROSS-REFERENCES TO RELATED APPLICATIONS

BACKGROUND OF THE INVENTION

The present invention relates generally to integrated circuits and, more particularly, to a seal ring structure for integrated circuits.

In the design and packaging of integrated circuits, moisture needs to be prevented from entering the circuits for a variety of reasons. Moisture can be trapped in oxides and increase the dielectric constant thereof, which affects, for example, the MIM capacitors, gate oxide capacitors, and parasitic interconnect capacitors. Moisture can also create trapped charge centers in gate oxides causing threshold voltage shifts in MOS transistors. Additionally, moisture can create interface states at the Si-gate oxide interface causing degradation in the transistor lifetime through increased hot-electron susceptibility. Moisture also can cause corrosion of the metal interconnect, reducing the reliability of the integrated circuit (IC). When trapped in Si-oxide, moisture reduces the oxide mechanical strength and the oxide becomes more prone to cracking due to tensile stress.

Ionic contaminants can also cause damage to the IC as they can diffuse rapidly in silicon oxide. For instance, ionic contaminants can cause threshold voltage instability in the CMOS transistors, and alter the surface potential of the Si surface in the vicinity of the ionic contaminants.

A seal ring is typically used to protect the IC from moisture degradation and ionic contamination. One conventional seal ring design is illustrated in FIGS. 1a and 1b. The seal ring 8 comprises a stack of metal/contact/via layers 10 (including metal M1–M6, vias V1–V5, contact Co, and intermetal oxide IMO0–IMO5) disposed on the die 12 and connected to the silicon substrate 14 (FIG. 1a). At the top are a passivation oxide layer 16 and a passivation nitride layer 18. Below the contact Co are salicide 22 and P$^+$ region 24 disposed adjacent a shallow trench isolation (STI) 26. The seal ring 8 provides a boundary around the entire IC chip 12 (FIG. 1b). This boundary forms an impervious wall around the IC circuits in the die 12, preventing moisture and ionic contamination from penetrating the IC 12.

The seal ring 8 has been shown to provide good protection to the circuit inside the die 12, and is widely used in the industry for integrated circuits. As seen in FIGS. 1a and 1b, the seal ring 8 electrically connects all round the die periphery. This electrical connection does not cause problems for digital circuits. Analog and RF circuits, however, are susceptible to low noise voltages. Efforts are made in the design of such circuits to prevent noise coupling from one circuit element to another. In an IC where there are digital circuits and RF/analog circuits integrated on the same Si-substrate, noise coupling prevention becomes a greater challenge. The digital circuits generate a substantial amount of noise and some of it is coupled to the substrate and can propagate through the substrate to other parts of the die. To reduce the impact of this on specially sensitive circuits, a common practice is to keep such sensitive circuits physically distant from the noisy digital circuits, while using a high resistivity substrate. The seal ring 8, however, electrically connects the periphery of the circuit 12 through a low resistance metal interconnect (M1–M6), as seen from FIGS. 1a and 1b. As a result of the presence of the conventional seal ring 8, circuits which were designed to be physically and electrically distant are brought electrically close to one other and allow coupling of noise between the circuit.

BRIEF SUMMARY OF THE INVENTION

Embodiments of the present invention provide a seal ring which includes a plurality of cuts separating the seal ring into seal ring portions which are disposed adjacent to different circuits in the integrated circuit die. The cuts reduce the noise coupling among the different circuits through the seal ring. To further isolate the sensitive RF/analog circuits from the noise generated by the digital circuit, the seal ring may be electrically (for dc noise) isolated from the substrate. This is accomplished, for instance, by inserting a polysilicon layer and gate oxide between the seal ring and the substrate. In addition, an n-well/p-well capacitor may be formed in series with the gate oxide, for instance, by implanting an n-well below the polysilicon layer in a p-type substrate. In this way, the seal ring provides substantially reduced noise coupling among the circuits but still maintains an effective wall around the periphery of the die to protect the circuits against moisture and ionic contamination penetration.

In accordance with an aspect of the present invention, an integrated circuit comprises a digital circuit and at least one of an analog circuit and an RF circuit in an integrated circuit die. A seal ring is disposed around the integrated circuit die. The seal ring includes at least one cut between a portion of the seal ring which is disposed adjacent to the digital circuit and another portion of the seal ring which is disposed adjacent to the at least one of an analog circuit and an RF circuit.

In some embodiments, the seal ring includes a plurality of cuts separating the seal ring into a plurality of seal ring portions disposed adjacent to different circuits in the integrated circuit die. The cut is about 0.3 μm to about 5 μm in width, and is typically about 1 μm in width. In specific embodiments, the seal ring comprises a metal stack disposed on a substrate along a boundary of the integrated circuit die, and the cut extends through the metal stack.

The seal ring desirably is at least substantially isolated electrically from the substrate of the integrated circuit die. In specific embodiments, the metal stack is separated from the substrate by a polysilicon layer. A gate oxide is formed between the polysilicon layer and the substrate. The gate oxide has a thickness of about 20 to about 100 angstroms. The substrate is a p-type substrate and an n-well is formed between the gate oxide and the p-type substrate.

In accordance with another aspect of the invention, an integrated circuit comprises a digital circuit and at least one of an analog circuit and an RF circuit in an integrated circuit die which includes a substrate. A seal ring is disposed on the substrate along a boundary of the integrated circuit die. The seal ring is at least substantially isolated electrically from the substrate of the integrated circuit die for reduction of noise coupling therebetween.

In some embodiments, the seal ring is separated from the substrate by a polysilicon layer and a gate oxide. An n-well/p-well capacitor is formed in the substrate in series with the gate oxide. The seal ring may include at least one cut between a portion of the seal ring which is disposed adjacent to the digital circuit and another portion of the seal ring which is disposed adjacent to the at least one of an analog circuit and an RF circuit.

Another aspect of the present invention is directed to a method of reducing noise coupling by a seal ring between a digital circuit and at least one of an analog circuit and an RF circuit in an integrated circuit die. The method includes forming a seal ring on a substrate of the integrated circuit die along a boundary of the integrated circuit die, and providing at least one cut in the seal ring to separate the seal ring into a plurality of seal ring portions which are disposed adjacent to different circuits in the integrated circuit die.

In some embodiments, the method includes providing a capacitance having a sufficiently large impedance between the seal ring and the substrate to reduce coupling of low frequency noise generated by the digital circuit therebetween. It may include forming a polysilicon layer and a gate oxide between the seal ring and the substrate. It may further include forming an n-well/p-well capacitor in the substrate in series with a gate oxide capacitor produced by the gate oxide. In specific embodiments, the n-well/p-well capacitor is formed by providing a p-type substrate and forming an n-well between the p-type substrate and the gate oxide.

DESCRIPTION OF THE SPECIFIC EMBODIMENTS

Figure 2:
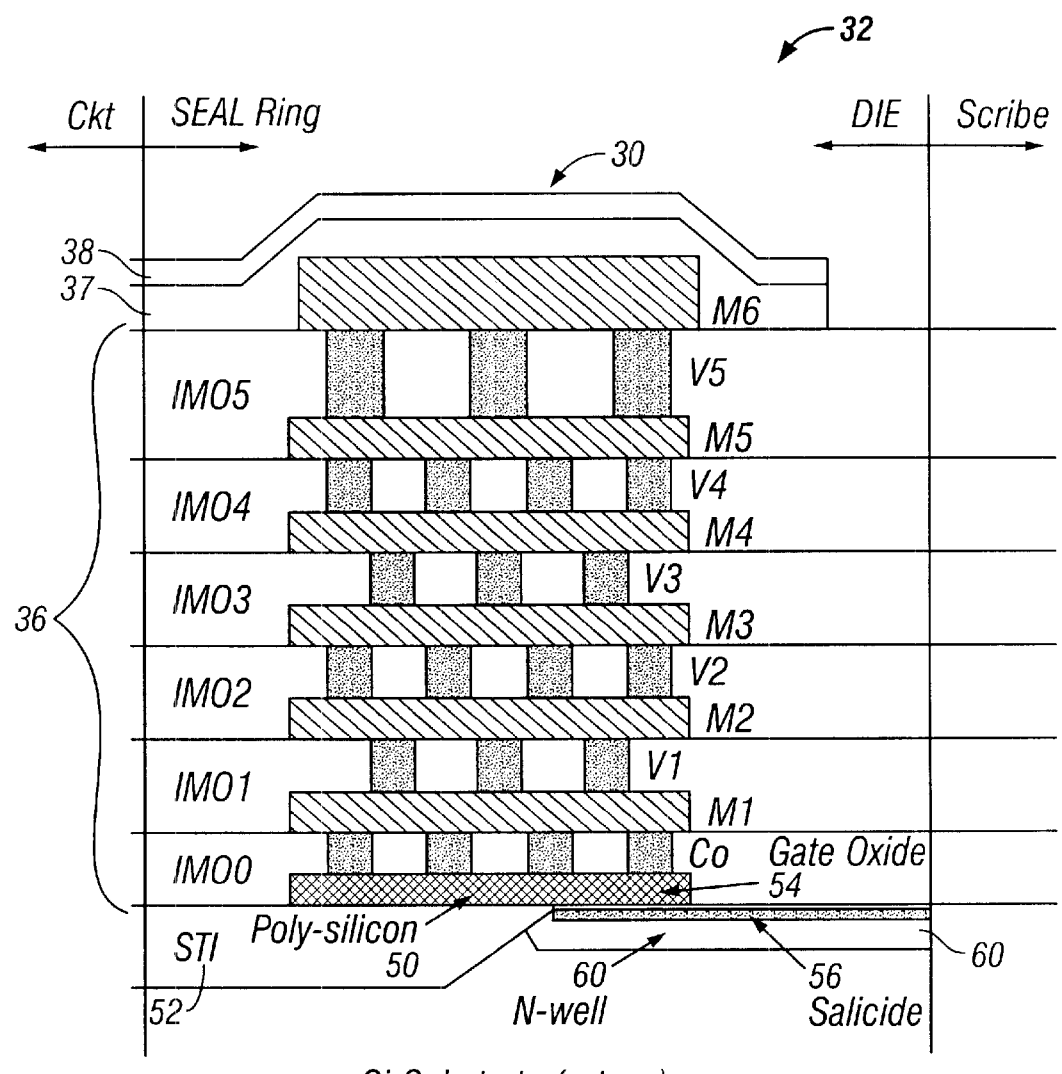
FIG. 2 shows a cross-section of an integrated circuit die with a seal ring according to an embodiment of the present invention.
Figure 3:
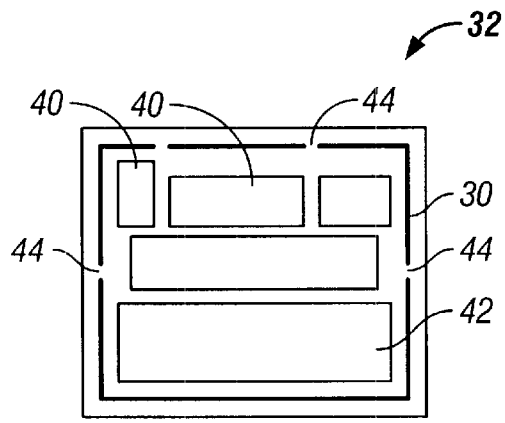
FIG. 3 is a top plan view of the integrated circuit die of FIG. 2 illustrating cuts in the seal ring around the die periphery.
Figure 4:
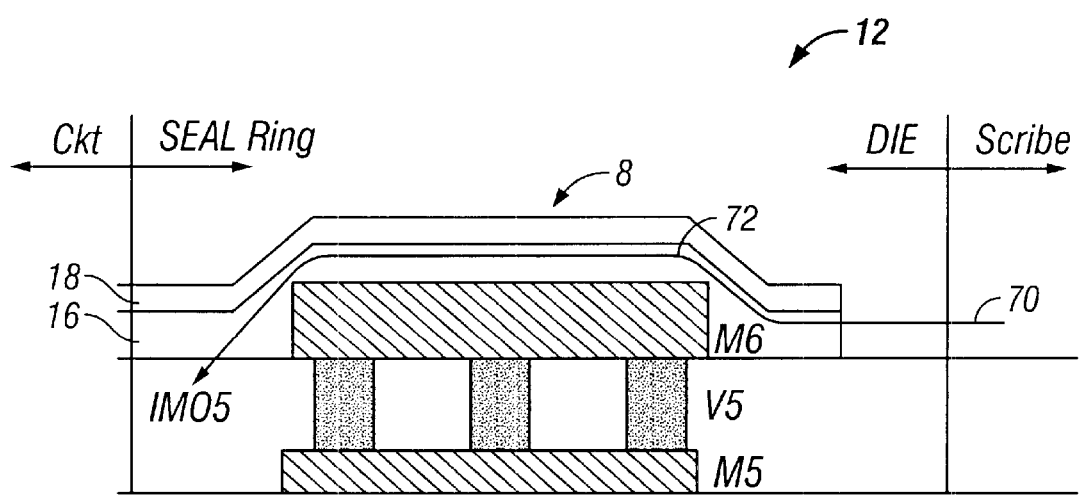
FIG. 4 shows a portion of the cross-section of the integrated circuit die with the conventional seal ring of FIG. 1a illustrating the moisture path through the passivation oxide at the die periphery.

FIGS. 2 and 3 show a seal ring 30 which alleviates the noise problems associated with previous seal rings. The seal ring 30 is suitable for an IC with RF and/or analog circuits such as an RFIC, and is particularly effective in reducing noise in an IC with integrated digital/RF/analog circuits. The seal ring 30 is typically made of metal.

As shown in FIG. 2, the die 32 includes the metal/contact/via stack 36 (including metal M1–M6, vias V1–V5, contact Co, and intermetal oxide IMO0–IMO5) connected to the silicon substrate 34. At the top are a passivation oxide layer 37 and a passivation nitride layer 38. The die 32 includes noise-sensitive RF/analog circuits 40 and noisy digital circuits 42, as shown in FIG. 3.

As illustrated in FIG. 3, the seal ring 30 forms a boundary around the IC chip 32 and extends up to the top metal layer which is metal 6 (M6) in FIG. 3. Different portions of the seal ring 30 are disposed adjacent to the various circuits in the IC chip 32. The seal ring 30 is cut in specific places to isolate the sensitive RF/analog circuits 40 from the noise generated in the digital circuits 42. The cuts 44 separate the seal ring portion disposed adjacent to the digital circuits 42 from the seal portions disposed adjacent to the RF/analog circuits 40. The cuts 44 may be formed between any or all neighboring circuits to separate the seal ring portion disposed adjacent to one circuit from the seal portion disposed adjacent to the neighboring circuit. These cuts 44 are of small widths (typically in the range of about 0.3 μm to about 5 μm, more typically about 1 μm).

Providing cuts 44 in the seal ring 30 alone, however, may not be adequate, since there is capacitive coupling between the ends of the interconnects (e.g., M1–M6) in the spaced seal ring portions at opposite sides of the cuts 44, allowing coupling for ac noise in the interconnect. To further isolate the sensitive RF/analog circuits 40 from the noise, the interconnect itself is electrically (for dc noise) isolated from the substrate 34, as shown in FIG. 2. This may be accomplished, for instance, in one of two ways as described below.

In the first approach, a polysilicon layer 50 is inserted between metal 1 layer M1 and the silicon substrate 34. The polysilicon layer 50 is separated from the substrate 34 by the shallow trench isolation (STI) oxide 52 in part of the structure and by the gate oxide 54 disposed above the salicide 56 in the remaining part of the structure. The gate oxide 54 is used in the outer part of the seal ring 30 as it is typically very thin (e.g., about 20 to about 100 angstroms, more typically about 35 angstroms, over process technologies ranging from about 0.13 μm to about 0.35 μm). Thus, an effective wall is still maintained around the periphery of the die 32 with the seal ring 30 to protect against moisture and ionic contamination penetration.

Additionally, an n-well 60 may be implanted below the polysilicon layer 50 to provide an n-well/p-well capacitor in series, which serves to filter out low frequency noise (e.g., a.c. noise in the 12 MHz level as compared to RF signal frequencies in the 2 GHz level). The thin gate oxide 54 forms a large capacitance, producing a small impedance. The introduction of the n-well 60 forms a small n-well/p-well capacitance in series with the gate oxide capacitance. As long as the gate oxide capacitance is much greater than the n-well/p-well capacitance, the effective capacitance (the product of the two capacitance values divided by the sum thereof) is approximately equal to the small n-well/p-well capacitance. This generates a large impedance which more effectively isolates lower frequency signals such as a.c. signals. This configuration considerably reduces the coupling of noise from the substrate 34.

It is noted that there is some exposure of the die 32 to moisture through the cuts 44 in the seal ring 30. The impact of the exposure is minimal as compared to the conventional seal ring as explained below.

Figure 1A:
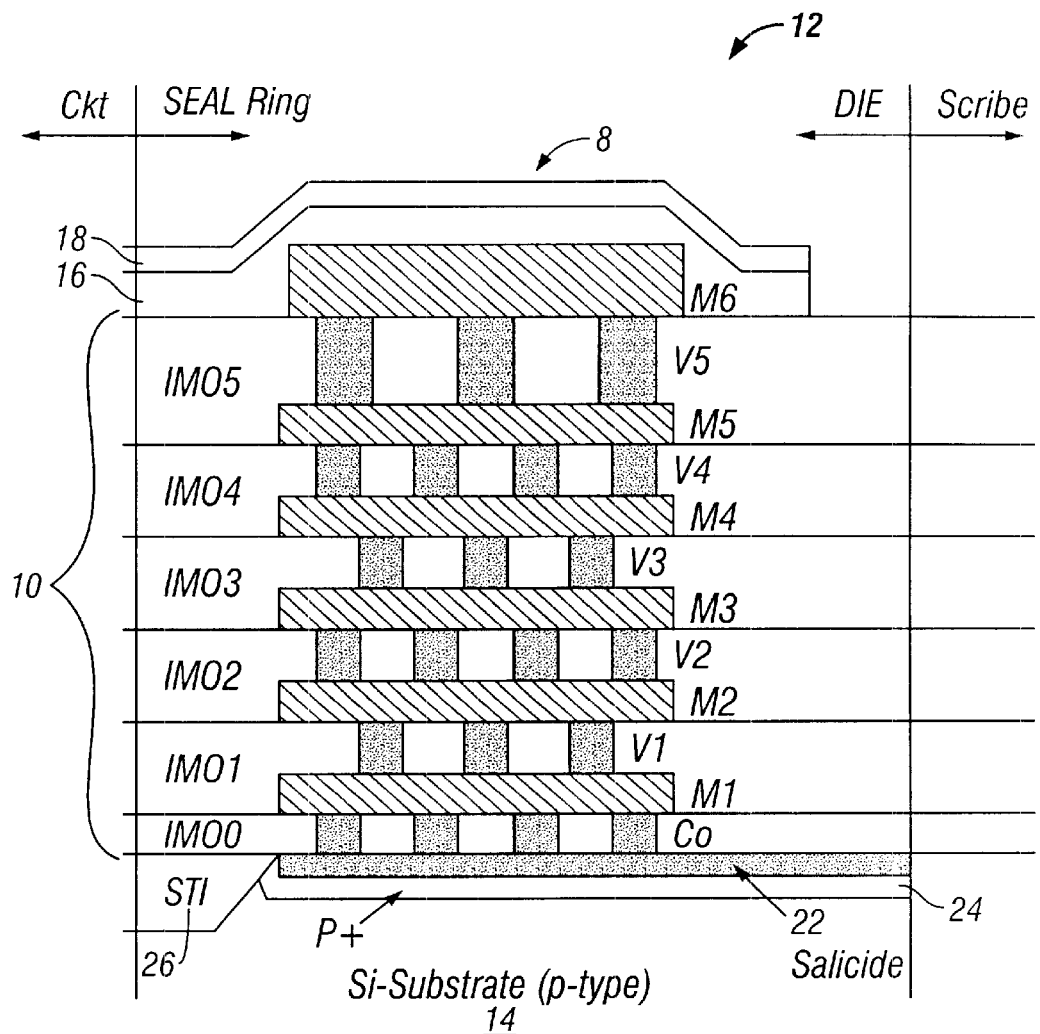
FIG. 1a shows a cross-section of an integrated circuit die with a conventional seal ring.
Figure 1B:
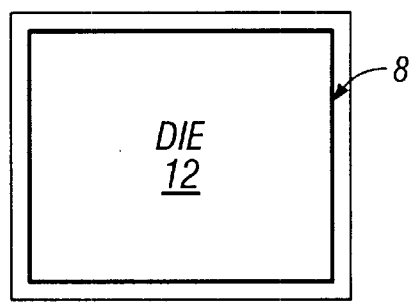
FIG. 1b is a top plan view of the integrated circuit die of FIG. 1a illustrating the seal ring around the die periphery.

In the case of the conventional seal ring 8 as shown in FIGS. 1a and 1b, there is also some moisture exposure through a moisture path 70, as shown in FIG. 3, through the passivation oxide 16. The passivation nitride (e.g., SiN) 18 is a very good barrier of moisture and ionic contamination. The passivation oxide 16 is usually doped with phosphorous to form phosphosilicate glass (PSG) to absorb and hold the moisture. It should also be noted that this same situation occurs at the bond pad openings as well. In recent technologies (0.25 and 0.18 μm technologies), however, the passivation oxide 16 has been deposited by HDP (high density plasma) and it has been difficult to incorporate the phosphorous initially. Nonetheless, the passivation oxide 16 without phosphorous has been used and has passed reliability tests.

The area at the bottle-neck 72 of the moisture path 70 as shown in the die 12 of FIG. 3 with the conventional seal ring 8 can be calculated and is given by:

$$\text{Area}_{conv.seal\ ring} = \text{(perimeter of die)} \times \text{(width of oxide at bottle-neck)} = 4\text{ cm (for a 1 cm}^2\text{ die)} \times 0.5\text{e-4 cm (the bottle neck width is typically in the range of 0.5 to 1.0 μm)} = 2\text{e-4 cm}^2.$$

The area of the moisture path created by the cuts 44 and the gate oxide 54 in the RFIC seal ring 30 of FIGS. 2 and 3 can also be estimated:

Area$_{RFIC\ seal\ ring}$=cut area×#of cuts×height of interconnect+ die periphery×gate oxide thickness=

1e−4 cm (1 µm cut)×10 (#of cuts)×10e−4 cm (height of interconnect over substrate)+4 cm (for 1 cm² die)×100e−8 (for 100 Å gate oxide thickness)+Area $_{conv.seal\ ring}$=1e−6+ 4e−6+2e−4 cm2 =2.05 e−4 cm2.

From the above calculation, it is seen that the total moisture path is dominated by the path through the passivation oxide 37 in the IC die 32 of FIG. 2. The increase in the area of the moisture path 70 for the RFIC seal ring 30 is about 2.5%. Since the conventional seal ring 8 is considered effective, the RFIC seal ring 30 is similarly effective and the impact of the moisture exposure from the seal ring cuts 44 is negligible.

In an alternative embodiment, the seal ring can be implemented with no cuts (i.e., using the conventional seal ring 8 of FIGS. 1a and 1b in the configuration of FIG. 2), but is isolated from the substrate 34 by the polysilicon layer 50, optionally with the n-well 60 to form an n-well/p-well capacitor in series (FIG. 2).

Embodiments of the RFIC seal ring of the present invention reduce the noise coupling on an IC containing digital/analog/RF circuits from the digital circuits to the sensitive RF/analog circuits. Advantageously, no process complexity is introduced in this structure.

The above-described arrangements of apparatus and methods are merely illustrative of applications of the principles of this invention and many other embodiments and modifications may be made without departing from the spirit and scope of the invention as defined in the claims. For example, the size, shape, and circuit configuration of the IC structure may be modified. The scope of the invention should, therefore, be determined not with reference to the above description, but instead should be determined with reference to the appended claims along with their full scope of equivalents.

What is claimed is:

1. An integrated circuit comprising:

a digital circuit and at least one of an analog circuit and an RF circuit in an integrated circuit die; and a seal ring disposed around the integrated circuit die, the seal ring including at least one cut between a portion of the seal ring which is disposed adjacent to the digital circuit and another portion of the seal ring which is disposed adjacent to the at least one of an analog circuit and an RF circuit.

2. The integrated circuit of claim 1 wherein the seal ring includes a plurality of cuts separating the seal ring into a plurality of seal ring portions disposed adjacent to different circuits in the integrated circuit die.

3. The integrated circuit of claim 1 wherein the at least one cut is about 0.3 µm to about 5 µm in width.

4. The integrated circuit of claim 3 wherein the at least one cut is about 1 µm in width.

5. The integrated circuit of claim 1 wherein the seal ring comprises a metal stack disposed on a substrate along a boundary of the integrated circuit die, and wherein the at least one cut extends through the metal stack.

6. The integrated circuit of claim 5 wherein the seal ring is at least substantially isolated electrically from the substrate of the integrated circuit die.

7. The integrated circuit of claim 5 wherein the metal stack is separated from the substrate by a polysilicon layer.

8. The integrated circuit of claim 7 wherein a gate oxide is formed between the polysilicon layer and the substrate.

9. The integrated circuit of claim 8 wherein the gate oxide has a thickness of about 20 to about 100 angstroms.

10. The integrated circuit of claim 8 wherein the substrate is a p-type substrate and wherein an n-well is formed between the gate oxide and the p-type substrate.

11. An integrated circuit comprising:

a digital circuit and at least one of an analog circuit and an RF circuit in an integrated circuit die which includes a substrate; and a seal ring disposed on the substrate along a boundary of the integrated circuit die, the seal ring being at least substantially isolated electrically from the substrate of the integrated circuit die for reduction of noise coupling therebetween.

12. The integrated circuit of claim 11 wherein the seal comprises a metal stack.

13. The integrated circuit of claim 11 wherein the seal ring comprises metal and is separated from the substrate by a polysilicon layer.

14. The integrated circuit of claim 13 wherein a gate oxide is formed between the polysilicon layer and the substrate.

15. The integrated circuit of claim 14 wherein the gate oxide has a thickness of about 20 to about 100 angstroms.

16. The integrated circuit of claim 14 wherein an n-well/p-well capacitor is formed in the substrate in series with the gate oxide.

17. The integrated circuit of claim 13 wherein the substrate is a p-type substrate and wherein an n-well is formed between the polysilicon layer and the p-type substrate.

18. The integrated circuit of claim 11 wherein the seal ring includes at least one cut between a portion of the seal ring which is disposed adjacent to the digital circuit and another portion of the seal ring which is disposed adjacent to the at least one of an analog circuit and an RF circuit.

* * * * *